United States Patent
Sohn

(10) Patent No.: US 8,193,624 B1
(45) Date of Patent: Jun. 5, 2012

(54) SEMICONDUCTOR DEVICE HAVING IMPROVED CONTACT INTERFACE RELIABILITY AND METHOD THEREFOR

(75) Inventor: Eun Sook Sohn, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 405 days.

(21) Appl. No.: 12/036,498

(22) Filed: Feb. 25, 2008

(51) Int. Cl.
*H01L 23/02* (2006.01)

(52) U.S. Cl. . 257/686; 257/687; 257/688; 257/E23.169; 257/725; 257/684; 257/685

(58) Field of Classification Search .......... 257/684–687, 257/692, 725, E23.169
See application file for complete search history.

(56) References Cited

U.S. PATENT DOCUMENTS

| | | | |
|---|---|---|---|
| 5,090,119 A | 2/1992 | Tsuda et al. | |
| 5,813,115 A | 9/1998 | Misawa et al. | |
| 6,433,425 B1 | 8/2002 | Sarkhel | |
| 6,578,755 B1 | 6/2003 | Elenius et al. | |
| 2004/0238948 A1* | 12/2004 | Shiozawa et al. | 257/723 |
| 2006/0267175 A1* | 11/2006 | Lee | 257/686 |
| 2007/0254404 A1* | 11/2007 | Gerber et al. | 438/109 |

* cited by examiner

*Primary Examiner* — Marcos D. Pizarro
*Assistant Examiner* — Eva Yan Montalvo
(74) *Attorney, Agent, or Firm* — Weiss & Moy, P.C.; Jeffrey D. Moy

(57) ABSTRACT

A semiconductor package assembly has a first semiconductor package. A plurality of first solder balls is attached to the first semiconductor package. A circuit board is provided having a plurality of mounting pads that is electrically connected to the plurality of first solder balls. A first underfill is disposed on each of the plurality of first solder balls. The first underfill is disposed on interfaces between each of the plurality of first solder balls and the first semiconductor package and each of the plurality of first solder balls and the circuit board. The first underfill is removed from an area between adjacent first solder balls.

11 Claims, 8 Drawing Sheets

SEMICONDUCTOR DEVICE HAVING IMPROVED CONTACT INTERFACE RELIABILITY AND METHOD THEREFOR

FIELD OF THE INVENTION

This invention relates to semiconductor devices and, more specifically, to a semiconductor device wherein an underfill is formed only on the solder ball interfaces thereby improving the reliability of the semiconductor device.

BACKGROUND OF THE INVENTION

Presently, semiconductor devices that are being used for portable electronic devices, such as a mobile phone, a personal digital assistant (PDA), and the like, need to be slim and have high integration. Because of this, semiconductor devices are being developed into a system package in a form of a Package on Package (PoP) and a Stacked CSP (S-CSP) using a stacking technology.

Furthermore, semiconductor devices needing slimness are being changed from a Dual Inline Package (DIP) of a Through Hole Mounting (THM) scheme into a form of a Quad Flat Package (QFP) and a Small Outline Package (SOP) which are devices of a Surface Mounting scheme with a slimmer size having an excellent electrical performance. Also, semiconductor devices needing high-integration generally use a Ball Grid Array (BGA) scheme based on a solder ball connection method to increase a number of I/O pins.

Such semiconductor devices are generally mounted to a printed circuit board of an electronic device using, a solder ball connection method. When using a solder ball connection method, an underfill is generally dispensed from a junction of the solder ball between the system package and the printed circuit board to supplement a thermal and mechanical characteristic for improving the reliability of the semiconductor device.

However, due to excessive contraction and expansion by heat during a thermal cycling (TC) test, the underfill may bring some damages to the junction of the solder ball, which results in decreasing a binding force of the solder ball between the semiconductor device and the printed circuit board. Also, the underfill may bring some damages to the junction of the solder ball between the semiconductor device and another semiconductor device formed by a solder ball connection method in a system package.

Therefore, a need existed to provide a device and method to overcome the above problems.

SUMMARY OF THE INVENTION

A semiconductor package assembly has a first semiconductor package. A plurality of first solder balls is attached to the first semiconductor package. A circuit board is provided having a plurality of mounting pads that is electrically connected to the plurality of first solder balls. A first underfill is disposed on each of the plurality of first solder balls. The first underfill is disposed on interfaces between each of the plurality of first solder balls and the first semiconductor package and each of the plurality of first solder balls and the circuit board. The first underfill is removed from an area between adjacent first solder balls.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
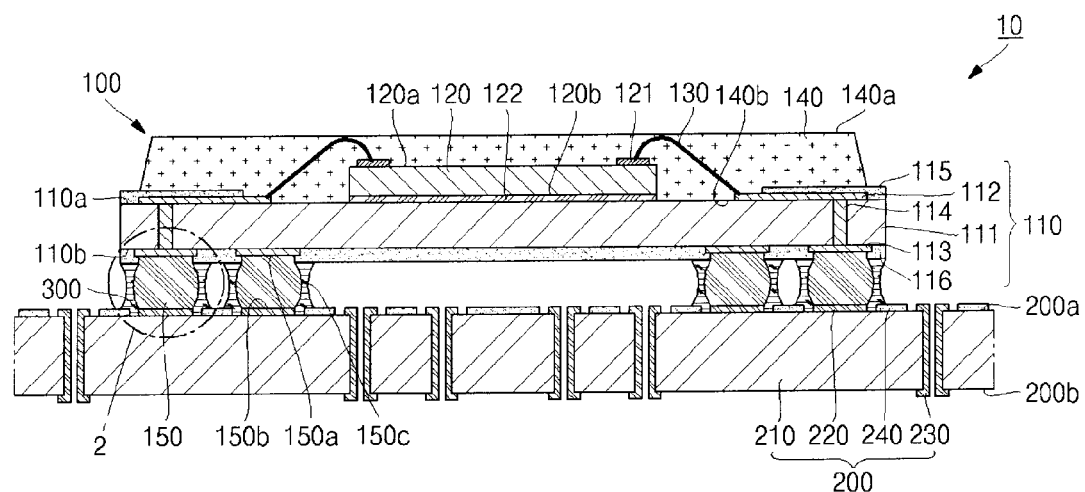
FIG. 1 is a cross-sectional view of a semiconductor package module according to a one embodiment of the present invention.

Referring to FIG. 1, a cross-sectional view of semiconductor package assembly according to one embodiment of the present invention is illustrated. And Referring to FIG. 2, an enlarged cross-sectional view of a region 2 of FIG. 1 is illustrated.

As shown in FIG. 1, the semiconductor package assembly 10 includes a first semiconductor package 100, a circuit board 200 to which the first semiconductor package 100 is mounted, and a first underfill 300 which is disposed between the first semiconductor package 100 and the first circuit board 200.

The first semiconductor package 100 includes a first substrate 110, a first semiconductor die 120 attached onto the first substrate 110, one or more first conductive wire 130 electrically connecting the first substrate 110 and the first semiconductor die 120, a first encapsulant 140 surrounding the first semiconductor die 120 and the first electrically conductive wire 130, and one or more first solder ball 150 attached to the first substrate 110.

The first substrate 110 includes an insulating layer 111 having an approximately planar first surface 110a and an approximately planar second surface 110b opposite to the first surface 110. The first substrate 110 will have conductive patterns formed on one or more layers thereof. In the embodiment shown in FIG. 1, the first substrate 110 has a plurality of first conductive patterns 112 formed on the first surface 110a, and a plurality of second conductive patterns 114 formed on the second surface 110b. In the embodiment shown, at least one first conductive pattern 112 and at least one second conductive pattern 113 may be electrically connected to each other through a first conductive via hole 114. The first substrate 110 may further include a first solder mask 115 and a second solder mask 116 to cover certain regions of the first conductive pattern 112 and the second conductive pattern 113 respectively. The first solder mask 115 and the second solder mask 116 functions to prevent the first conductive pattern 112 and the second conductive pattern 113 from excessively being exposed to a outside elements that may cause oxidation and corrosion. The first substrate 110 may be any one of a general hard printed circuit substrate and a flexible printed circuit substrate or an equivalent thereof. However, the present invention is not limited thereto. The first solder ball 150 is electrically connected to the second conductive pattern 113 of the first substrate 110. The second conductive pattern 113 and the first solder ball 150 are relatively stably bonded to each other in a thermal or a mechanical aspect by the first underfill 300.

The first semiconductor die 120 includes an approximately planar first surface 120a and an approximately planar second surface 120b opposite to the first surface 120a. One or more first bond pad 121 is formed on the first surface 120a. The second surface 120b of the first semiconductor die 120 is attached onto the first surface 110a of the first substrate 110. In this case, the first semiconductor die 120 may be completely attached onto the first substrate 110 using an adhesive 122 formed between the second surface 120b of the first semiconductor die 120 and the first surface 110a of the first substrate 110. The adhesive 122 may include any one of an epoxy adhesive, a double-faced adhesive tape, and a double-faced adhesive film, or an equivalent thereof. The above is given as an example and should not be seen as to limit the scope of the present invention.

The first electrically conductive wire 130 electrically connects the first substrate 110 and the first semiconductor die 120. Specifically, the first electrically conductive wire 130 electrically connects at least one first conductive pattern 112 and at least one first bond pad 121. The first electrically conductive wire 130 may be made of a material including any one of gold, silver, copper, and aluminum, or an equivalent thereof. However, the present invention does not limit the material of the first electrically conductive wire 130 to the aforementioned. Other materials may be used without departing from the spirit and scope of the present invention. Like the first bond pad 121, at least one first electrically conductive wire 130 may be formed. However, the present invention does not particularly limit the number of first electrically conductive wires 130. The first semiconductor die 120 may be coupled to the first substrate 110 in other manners. For example, in another embodiment, the first semiconductor die 120 is interconnected to the first substrate 110 via flipchip interconnections.

The first encapsulant 140 is used to encapsulate the first electrically conductive wire 130 and the first semiconductor die 120 on the first surface 110a of the first substrate 110. The first encapsulant 140 includes an approximately planar first surface 140a and an approximately planar second surface 140b opposite to the first surface 140a. The first surface 140a of the first encapsulant 140 may be externally exposed, and the second surface 140 of the first encapsulant 140 contacts with the first substrate 110. In this instance, the second surface 140b of the first encapsulant 140 may be formed to have a smaller area than the first surface 110a to externally expose a portion of the first substrate 110a. However, the present invention is not limited thereto. Also, the first surface 140a may be formed to have a relatively smaller area than the second surface 140b. However, the present invention is not limited thereto. The first encapsulant 140 encapsulates the first semiconductor die 120 and the first electrically conductive wire 130 and thereby protects the first semiconductor die 120 and the first electrically conductive wire 130 from an external shock and corrosion. The first encapsulant 140 may be any one of an epoxy compound carrying out an encapsulation using a mold, a liquid sealing material carrying out the encapsulation using a dispenser, and an equivalent thereof. However, the present invention does not particularly limit the material of the first encapsulant 140.

The first solder ball 150 is formed to be electrically connected to the second conductive pattern 113 of the first substrate 110. The first solder ball 150 functions to be electrically connected to the circuit board 200, which will be described later, and to send and receive electrical signals of the semiconductor package 100 to outside devices via the circuit board 200. The first solder ball 150 may be formed of Sn/Pb and Leedless Sn, or an equivalent thereof. However, the present invention does not particularly limit the material of the first solder ball 150 to the aforementioned. Other materials may be used without departing from the spirit and scope of the present invention. The first solder ball 150 includes a first interface 150a and a second interface 150b which contact with the first substrate 110 and the circuit board 200 respectively. Also, the first solder ball 150 may expose a remaining surface 150c, excluding the first interface 150a and the second interface 150b, between the first substrate 110 and the circuit board 200. The first underfill 300 is formed on the surface 150c of the first solder ball 150. The first underfill 300 will be described in detail later.

The circuit board 200 includes an approximately planar first surface 200a and an approximately planar second surface 200b opposite to the first surface 200a. The circuit board 200 includes an insulating layer 210, a mounting pad 220, a through via 230, and a solder mask 240. The mounting pad 220 is formed on the first surface 200a of the circuit board 200. At least one mounting pad 220 is electrically connected to the first solder ball 150 of the first semiconductor package 110. In this case, the mounting pad 220 and the first solder ball 150 are relatively stably bonded to each other in a thermal or a mechanical aspect by the first underfill 300, which will be described later. The mounting pad 220 may be formed through a patterning process, such as a photo-lithography after laminating a copper clan on the insulating layer 210. Also, the mounting pad 220 may be plated or treated with Organic Solderability Preservative (OSP) processing using gold, silver, and Sn, or an equivalent thereof, in order to have an electrically stable characteristic. However, the present invention does not particularly limit a forming method of the mounting pad 220 and a material thereof as described above. The mounting pad 220 may further include a connector (not shown) for an electrical connection to an external device and a component (not shown), such as, a capacitor, resistance, and the like, in addition to the first semiconductor package 100. However, the present invention is not limited thereto.

The through via 230 may be formed between the first surface 200a and the second surface 200b of the circuit board 200. The through via 230 may be formed by initially making a hole in the circuit board 200 using a drill or a laser and a Computer Numerical Control (CNC), or an equivalent method, and then plating the hole with a conductive material such as copper and the like. However, the present invention does not particularly limit the forming method of the through via 230. The through via 230 may be generally formed to help complex wiring of the circuit board 200. Also, the through via 230 may be used as an underfill discharge path to form the first underfill 300, which will be described later. A forming method of the first underfill 300 using the through via 230 will be described later. The solder mask 240 is provided to cover a periphery of the through via 230 and the mounting pad 220 on the first surface 200a of the circuit board 200. The solder mask 240 may be provided to cover a portion of the mounting pad 220 or the through via 230, however the present invention is not limited thereto.

Another solder mask (not shown) may be further formed on the second surface 200b of the circuit board 200 to cover a conductive pad (not shown), such as the mounting pad 220, and a periphery of the conductive pad. The circuit board 200 of FIG. 1 is formed in a single layer, however, the circuit board 200 may be provided in a multi-layer configuration.

Also, the circuit board 200 may be a main board to drive an electronic device, such as a mobile phone, a PDA, and the like, or a sub-board to assist an operation of the main board. However, the present invention is not limited thereto.

The first underfill 300 is disposed between the first semiconductor package 100 and the circuit board 200. The first underfill 300 may be provided to surround the first solder ball 150. The first underfill 300 is formed to cover the remaining surface 150c, excluding the first interface 150a and the second interface 150b, as if the first underfill 300 coats the surface 150c. The first underfill 300 functions to thermally and mechanically maintain a relatively stable bonding between the first semiconductor package 100 and the first solder ball 150, and between the first solder ball 150 and the circuit board 200. The first underfill 300 may be formed of a material, such as an epoxy resin, a thermosetting resin, and a polymer, or an equivalent thereof. However, the present invention is not limited thereto. Hereinafter, the first underfill 300 according to the present invention will be further described in detail with reference to FIG. 2.

Figure 2:
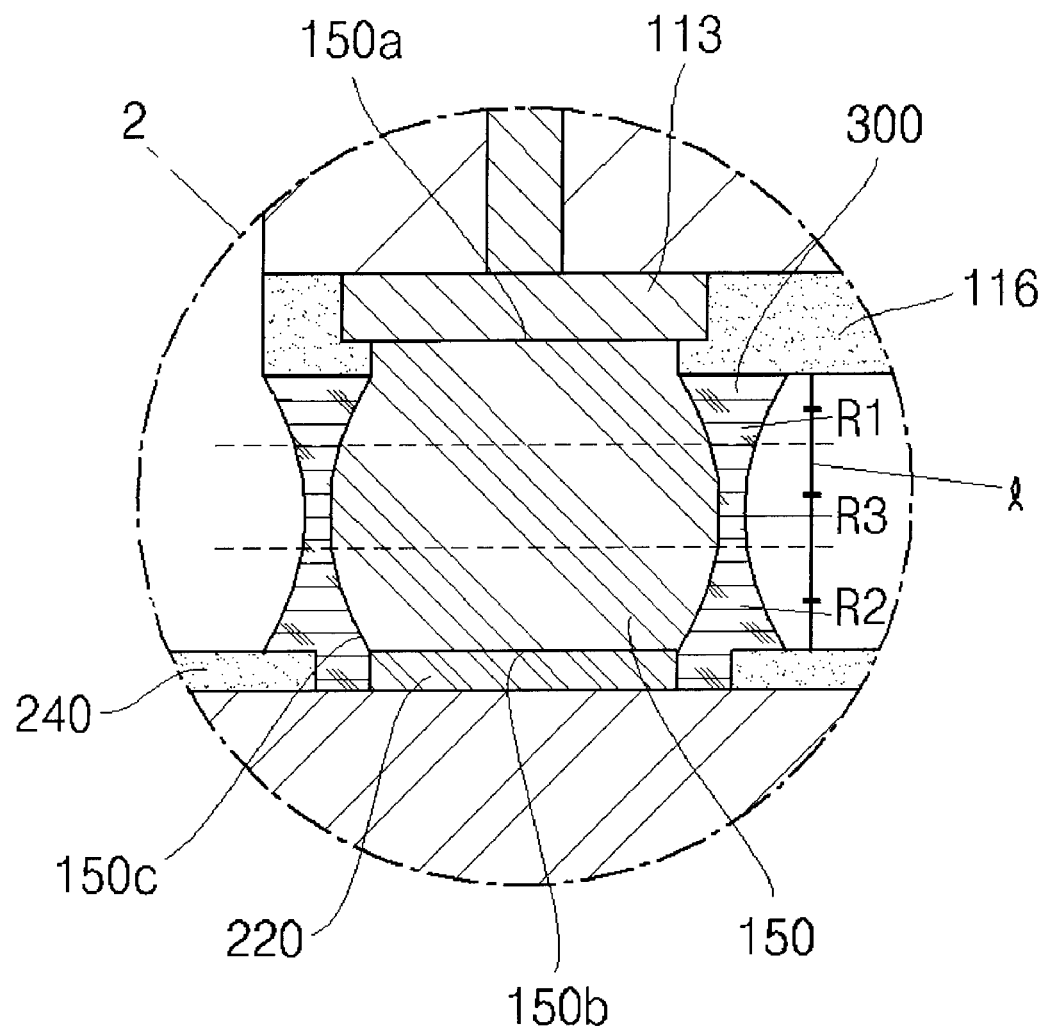
FIG. 2 is an enlarged cross-sectional view of a region 2 of FIG. 1.

As shown in FIG. 2, the first underfill 300 may be divided into a first region R1, a second region R2, and a third region R3, based on the first solder ball 150. The first through the third regions (R1 through R3) are trisections respectively, based on a distance l between the first substrate 110 and the circuit board 200. In this instance, the first through the third regions (R1 through R3) of the first underfill 300 are integrally formed at the same time when the first underfill 300 is formed.

The first region R1 of the first underfill 300 indicates a region that is formed between the surface 150c of the first solder ball 150 and the first substrate 110. The first region R1 may cover at least one portion of the second solder mask 116 of the first substrate 110. In this instance, the first region R1 is a peripheral part of the first interface 150a corresponding to a contact surface between the first substrate 110 and the first solder ball 150. The second region R2 of the first underfill 300 indicates a region that is formed between the surface 150c of the first solder ball 150 and the circuit board 200. The second region R2 of the first underfill 300 may cover at least one portion of the solder mask 240 of the circuit board 200. In this instance, the second region R2 of the first underfill 300 is a peripheral part of the second interface 150b corresponding to a contact surface between the first solder ball 150 and the circuit board 200. Also, the third region R3 of the first underfill 300 indicates a region that covers an approximately central portion of the surface of the first solder ball 150. Such the first underfill 300 may be concentrated on the first region R1 and the second region R2. The first region R1 requires a relatively greater amount of underfill to increase a binding force of the first solder ball 150 and the second conductive pattern 1130 as the peripheral part of the first interface 150a. The second region R2 also requires a relatively greater amount of underfill to increase a binding force of the first solder ball 150 and the mounting pad 220 as the peripheral part of the second interface 150b. Specifically, in comparison to the third region R3, a relatively greater amount of underfill may be formed on the first region R1 and the second region R2 of the first underfill 300. Specifically, the first region R1 and the second region R2 have a relatively wider vertical cross-sectional area than the third region R3. However, the present invention does not particularly limit the vertical cross-sectional area of the first through the third regions (R1 through R3).

The first solder ball 150 is formed in an approximately spherical shape, and thus the first interface 150a and the second interface 150b have the almost same area. Thus, an exposed surface of the first region R1 that is formed between the first substrate 110 and the circuit board 200 may have the approximately same shape as an exposed surface of the second region R2 that is formed between the first substrate 110 and the circuit board 200. The first underfill 300 may be in an approximate sandglass, based on the first solder ball 150. However, the present invention does not particularly limit the shape of the first underfill 300.

As described above, in the semiconductor package module 10, when mounting the first semiconductor package 100 onto the circuit board 200, the first underfill 300 is formed based on the peripheral parts of the solder ball interfaces 150a and 150b contacting with the first solder ball 150, increasing the binding force of the first semiconductor package 100, the first solder ball 150, and the circuit board 200. The first underfill 300 is formed for each first solder ball 150, based on the solder ball interfaces 150a and 150b, is not formed in another region between the first semiconductor package 100 and the circuit board 200 where the first solder ball 150 is not provided. Therefore, the first underfill 300 is not excessively contracted or expanded thereby improving reliability of the semiconductor package assembly 10.

Figure 3:
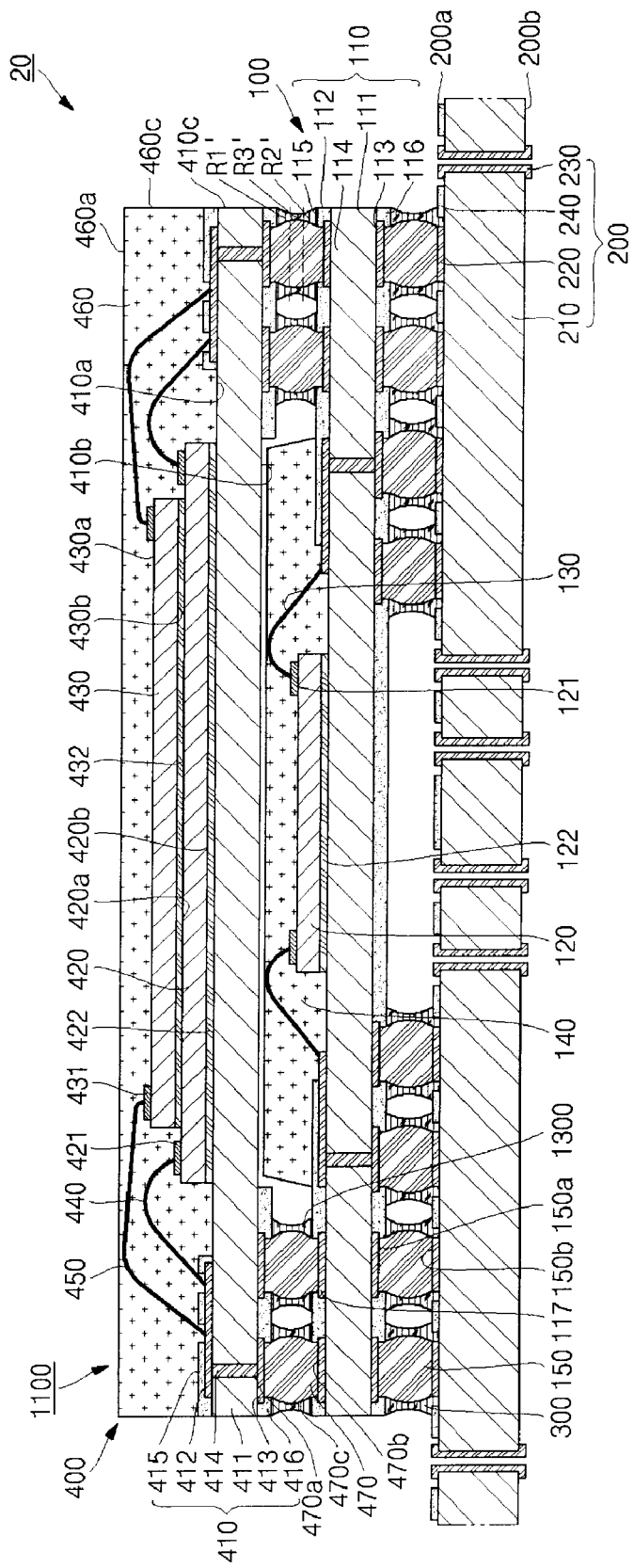
FIG. 3 is a cross-sectional view of a semiconductor package module according to another embodiment of the present invention.

Referring to FIG. 3, a cross-sectional view of a semiconductor package assembly according to another exemplary embodiment of the present invention is illustrated. As shown in FIG. 3, the semiconductor package assembly 20 according to the present embodiment includes a semiconductor package 1100, a circuit board 200 to which the semiconductor package 1100 is mounted, and a first underfill 300 which is disposed between the semiconductor package 1100 and the circuit board 200. Since the semiconductor package module 20 according to the present embodiment of the present invention has a similar configuration as the semiconductor package module 10, the differences there between will be described. Also, the like reference numerals will be used to the like elements throughout the semiconductor package module 20.

The semiconductor package 1100 includes a first semiconductor package 100, a second semiconductor package 400, and a second underfill 1300 disposed between the first semiconductor package 100 and the second semiconductor package 400. The second semiconductor package 400 is bonded to the first semiconductor package 100 by a solder ball bonding method; however, the present invention is not limited to the aforementioned. Other methods may be used without departing from the spirit and scope of the present invention.

The first semiconductor package 100 includes a first substrate 110, a first semiconductor die 120 attached onto the first substrate 110, a first conductive wire 130 electrically connecting the first substrate 110 and the first semiconductor die 120, a first encapsulant 140 surrounding the first semiconductor die 120 and the first conductive wire 130, and a first solder ball 150 attached to the first substrate 110. The first semiconductor package 100 further includes at least one third conductive pattern 117 formed on a periphery of the first encapsulant 140 on the first substrate 110. The third conductive pattern 117 may include the same material as the first conductive pattern 112, and may be formed by the same method. The first semiconductor package 100 is similar to the first semiconductor package 100 of FIG. 1 but further includes the third conductive pattern 117 and thus further detailed descriptions related thereto will be omitted.

The second semiconductor package 400 includes a second substrate 410, a second semiconductor die 420 attached onto the second substrate 410, a third semiconductor die 430 attached onto the second semiconductor die 420, a second conductive wire 440 electrically connecting the second substrate 410 and the second semiconductor die 420, a third conductive wire 450 electrically connecting the second substrate 410 and the third semiconductor die 430, a second encapsulant 460 surrounding the second semiconductor die 420 and the third semiconductor die 430, and a second solder ball 470 fused to the second substrate 410.

The second substrate 410 includes an insulating layer 411 having an approximately planar first surface 410a, an approximately planar second surface 410b opposite to the first surface 410, and a third surface 410c that is approximately vertical to the first surface 410a and the second surface 410b. The first surface 410a includes a plurality of fourth conductive patterns 412, and the second surface 410b includes a plurality of fifth conductive patterns 413. In this instance, at least one fourth conductive pattern 412 and at least one fifth conductive pattern 413 may be electrically connected to each other through a second conductive through via 414. The second substrate 410 includes a third solder mask 415 and a fourth solder mask 416 that cover the fourth conductive pattern 412 and the fifth conductive pattern 413, respectively, or that are formed on a periphery of the fifth conductive pattern 413 and the fourth conductive pattern 412. In this case, the second solder ball 470 is electrically connected to the fifth conductive pattern 413. The fifth conductive pattern 413 and the second solder ball 470 are relatively stably bonded to each other in a thermal or a mechanical aspect by the second underfill 1300, which will be described later.

The third semiconductor die 430 includes an approximately planar first surface 430a and an approximately planar second surface 430b opposite to the first surface 430a. A plurality of third bond pads 431 is formed on the first surface 430a of the third semiconductor die 430. The second surface 430b of the third semiconductor die 430 is attached onto the first surface 410a of the second substrate 410 using an adhesive 432. The second semiconductor die 420 may be approximately larger than the third semiconductor die 430. Specifically, the first surface 420a of the second semiconductor die 420 may be relatively wider than the first surface 430a of the third semiconductor die 430. However, the present invention does not limit the size of the second semiconductor die 420 and the third semiconductor die 430 and thus may be variously provided depending on a design of those skilled in the art or a type of a semiconductor package.

The second conductive wire 440 electrically connects at least one fourth conductive pattern 412 and at least one second bond pad 421. Also, the third conductive wire 450 electrically connects at least one fourth conductive pattern 412 and at least one third bond pad 431. The second conductive wire 440 and the third conductive wire 450 may be formed at the same time. Also, the second conductive wire 440 and the third conductive wire 450 may be formed of the same material as the first conductive wire 130 shown in FIG. 1.

The second encapsulant 460 is formed on the first surface 410a of the second substrate 410. The second encapsulant 460 is encapsulated to surround a periphery of the second and the third conductive wires 440 and 450, and the second and the third semiconductor dies 420 and 430. The second encapsulant 460 includes an approximately planar first surface 460a, an approximately planar second surface 460b opposite to the first surface 460a, and a third surface 460c that is approximately vertical to the first surface 460a and the second surface 460b. The third surface 460c of the second encapsulant 460 may be formed to be approximately planar to the third surface 410c of the second substrate 410 however; the present invention is not limited thereto. The first surface 460a may be externally exposed. The second encapsulant 460 may be formed of an equivalent material as the first encapsulant 140.

The second solder ball 470 is formed to be electrically connected to the fifth conductive pattern 413 of the second substrate 410. The second solder ball 470 functions as mechanical and electrical bonding means between the first semiconductor package 100 and the second semiconductor package 300. Specifically, the second solder ball 470 electrically connects the fifth conductive pattern 413 of the second substrate 410 and the third conductive pattern 117 of the first substrate 110. The second solder ball 470 may be formed of an equivalent material to the first solder ball 150. The second solder ball 470 includes a third interface 470a and a fourth interface 470b which contact with the first substrate 110 and the second substrate 410 respectively. Also, the second solder ball 470 may expose a remaining surface 470c, excluding the first interface 470a and the second interface 470b, between the first substrate 110 and the second substrate 410. The second underfill 1300 is formed on the surface 470c of the second solder ball 470.

The second underfill 1300 may be formed during a bonding process of the first semiconductor package 100 and the second semiconductor package 400. Alternatively, the second underfill 1300 and the first underfill 300 may be provided at the same time after mounting the circuit board 200 onto the circuit board 200. The second underfill 1300 may be formed in the approximately same shape to the first underfill 300. Specifically, the second underfill 1300 includes a first region R1' that is formed between the surface 470c of the second solder ball 470 and the second substrate 410, a second region R2' that is formed between the surface 470c of the second solder ball 470 and the first substrate 110, and a third region R3' that covers an approximately central portion of the surface 470c of the second solder ball 470. In this case, the second underfill 1300 is concentrated on the first region R1' and the second region R2' and thus the first region R1' and the second region R2' are foamed to have a relatively wider vertical cross-sectional area than the third region R3'. An exposed surface of the first region R1' that is formed between the first substrate 110 and the second substrate 410 may have the approximately same shape as an exposed surface of the second region R2' between the first substrate 110 and the second substrate 410. The second underfill 1300 may be an equivalent material to the material of the first underfill 300, however, the present invention is not limited thereto.

The circuit board 200 includes an insulating layer 210, a mounting pad 220, a through via 230, and a solder mask 240. The semiconductor package 1100 is mounted onto at least one mounting pad 220. The circuit board 200 is approximately similar to the circuit board 200 of FIG. 1, and thus further detailed descriptions related thereto will be omitted.

The first underfill 300 is disposed between the semiconductor package 1100 and the circuit board 200. The first underfill 300 may be provided to surround the first solder ball 150. The first underfill 300 is approximately the same as the underfill 300 of FIG. 1 and thus further detailed descriptions related thereto will be omitted here.

As described above, the semiconductor package module 20 may reinforce a solder ball binding force between the circuit board 200 and the semiconductor package 1100 through the first underfill 300 formed on each first solder ball 150. At the same time, the semiconductor package module 20 may reinforce a solder ball binding force between the first semiconductor package 100 and the second semiconductor package 400 through the second underfill 1300 formed on each second solder ball 470. Therefore, the reliability of the semiconductor package module 20 and the semiconductor package 1100 may be improved.

Figure 4:
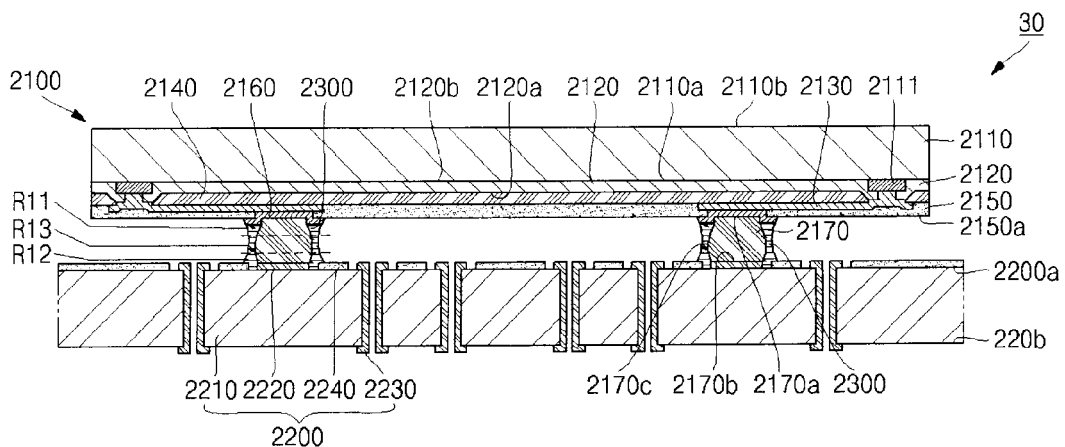
FIG. 4 is a cross-sectional view of a semiconductor package module according to still another embodiment of the present invention.

Referring to FIG. 4, a cross-sectional view of a semiconductor package assembly according to still another exemplary embodiment of the present invention is illustrated. As shown in FIG. 4, the semiconductor package assembly 30 includes a semiconductor package 2100, a circuit board 2200 to which the semiconductor package 2100 is mounted, and an underfill 2300 that is disposed between the semiconductor package 2100 and the circuit board 2200. Hereinafter, a difference between the semiconductor package module 30 and the semiconductor package assemblies 10 and 20 of FIGS. 1 and 3 will be described.

The semiconductor package 2100 includes a semiconductor die 2110, a passivation layer 2120 being formed on the semiconductor die 2110, a redistribution layer 2130 being electrically connected to the semiconductor die 2110, an insulative layer 2140 being disposed between the passivation layer 2120 and the redistribution layer 2130, a protective layer 2150 covering the insulating film 2140, an Under Bump Metaliztion (UBM) layer 2160 being electrically connected to the redistribution layer 2130, and a solder ball 2170 being electrically connected to the UBM layer 2160.

The semiconductor die 2110 includes an approximately planar first surface 2110a and an approximately planar second surface 2110b opposite to the first surface 2110a. A plurality of bond pads 2111 is formed on the first surface 2110a of the semiconductor die 2110. The bond pad 2111 may be formed on an approximate edge or an approximate center of the semiconductor die 2110, but the present invention is not limited thereto.

The passivation layer 2120 includes an approximately planar first surface 2120a and an approximately planar second surface 2120b opposite to the first surface. The passivation layer 2120 is provided to cover the first surface 2110a of the semiconductor die 2110. Here, a portion of the first surface 2120a of the passivation layer 2120 exposes the bond pad 2111. The passivation layer 2120 may include any one of a silicon dioxide film and a nitrification film, or an equivalent thereof. However the present invention is not limited to the aforementioned materials. Other materials may be used without departing from the spirit and scope of the present invention. The passivation layer 2120 may be formed by chemical plating, or an equivalent method thereof, however the present invention is not limited thereto. The bond pad 2111 may be externally exposed from the passivation layer 2120 by forming the passivation layer 2120 on the first surface 2110a of the semiconductor die 2110 and then etching a portion where the bond pad 2111 is formed.

The redistribution layer 2130 is electrically connected to the bond pad 2111. The redistribution layer 2130 may be extended on the first surface 2120a of the passivation layer 2120. The redistribution layer 2130 may include cupper (Cu) or alloys of copper, however the present invention is not limited thereto. The redistribution layer 2130 may be formed by sputtering, or other methods.

The insulative layer 2140 may be provided to even a space between the passivation layer 2120 and the redistribution layer 2130. The insulative layer 2140 may be formed in a single layer or a multi-layer including poly imide, epoxy, a silicon dioxide film, and a nitrification film or an equivalent thereof. However, the above listing is given as an example and should not be seen as to limit the scope of the present invention. Other materials may be used without departing from the spirit and scope of the present invention. In this instance, like the passivation layer 2120, the insulative layer 2140 may be formed to expose the bond pad 2111.

The protective layer 2150 may partially expose the redistribution layer 2130, and cover the insulative layer 2140. The protective layer 2150 includes an approximately planar first surface 2150a, and the first surface 2150a is externally exposed. The protective layer 2150 functions to prevent the semiconductor package 2100 from oxidation or corrosion due to an external element. The protective layer 2150 may be formed of an equivalent material to the insulative layer 2140. Also, an exposed portion of the redistribution layer 2130 may be formed by forming the protective layer 2150 and etching the same.

The UBM 2160 is electrically connected to the redistribution layer 2130 that is exposed from the protective layer 2150. The UBM 2160 is formed due to reasons, such as improvement of electrical characteristics and solder ball wettability when the UBM 2160 is electrically connected to the solder ball 2170. The UBM 2160 may be formed by plating any one of Cr, Cu, Ni, Au, Al, and Ti, or an equivalent material thereof, in a single layer or a multi-layer. The listing of the above is given as an example and should not be seen as to limit the scope of the present invention.

The solder ball 2170 is electrically connected to the UBM 2160. The solder ball 2170 electrically and mechanically bonds the semiconductor package 2100 and the circuit board 2200, which will be described later. The solder ball 2170 may be formed of Sn/Pb and Leedless Sn, or an equivalent thereof. However, the present invention does not particularly limit the material of the solder ball 2170 to the above mentioned. The solder ball 2170 includes a first interface 2170a and a second interface 2170b which contact with the UBM 2160 and the circuit board 2200 respectively. Also, the solder ball 2170 may expose a remaining interface 2170c, excluding the first and the second interfaces 2170a and 2170b, between the UBM 2160 and the circuit board 2200. The underfill 2300 is formed on the surface 2170c of the solder ball 2170.

The circuit board 2200 includes an insulating layer 2210, a mounting pad 2220, a through via 2230, and a solder mask 2240. The semiconductor package 2100 is mounted onto at least one mounting pad 2220. Also, the circuit board 2200 may be a main board to drive an electronic device, such as a mobile phone, a PDA, and the like, or a sub-board to assist an operation of the main board. However, the present invention is not limited thereto. The circuit board 2200 is substantially identical to the circuit board 200 of FIG. 1 and thus further detailed descriptions related thereto will be omitted here and refer to the circuit board 200.

The underfill 2300 is disposed between the semiconductor package 2100 and the circuit board 2200. The underfill 2300 may be provided to surround the solder ball 2170. The underfill 2300 includes a first region R11 that is formed between the surface 2170c of the solder ball 2170 and the protective layer 2150, a second region R12 that is formed between the surface 2170c of the solder ball 2170 and the circuit board 2200, and a third region R13 that covers an approximately central portion of the surface 2170c of the solder ball 2170. In this case, the underfill is concentrated on the first region R11 and the second region R12, and thus the first region R11 and the second region R12 are formed to have a relatively wider vertical cross-sectional area than the third region R13. An exposed surface of the first region R11 that is formed between the protective layer 2150 and the circuit board 2200 may have the approximately same shape as an exposed surface of the second region R12 between the protective layer 2150 and the circuit board 2200. The underfill 2300 is formed in the approximately same shape as the underfill 300 of FIG. 1. The underfill 2300 is generally formed on each solder ball 2170. Also, the underfill 2300 may be formed of an equivalent material to the underfill 300.

The semiconductor package module 30 may reinforce a solder ball binding force between the semiconductor package 2100 and the circuit board 2200 through the underfill 2300. Accordingly, it is possible to improve the reliability of the semiconductor package module 30.

Figure 5:
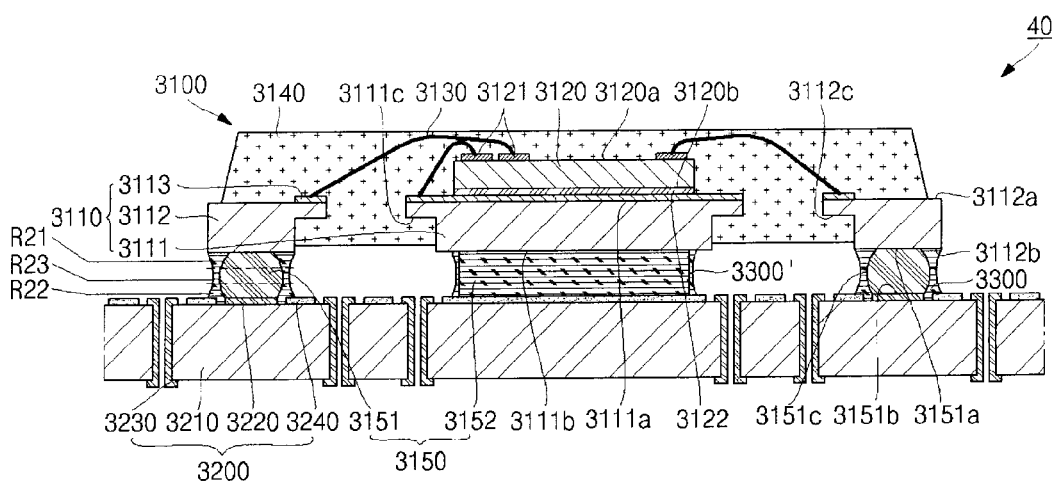
FIG. 5 is a cross-sectional view of a semiconductor package module according to yet another embodiment of the present invention.

Referring to FIG. 5 a cross-sectional view of a semiconductor package assembly according to yet another embodiment of the present invention is illustrated. As shown in FIG. 5, the semiconductor package assembly 40 according to the present embodiment includes a semiconductor package 3100, a circuit board 3200 to which the semiconductor package 3100 is mounted, and a first underfill 3300 that is disposed between the semiconductor package 3100 and the circuit board 3200. Hereinafter, a difference between the semiconductor package module 40 and the semiconductor package modules 10, 20, and 30 of FIGS. 1 through 3 will be described.

The semiconductor package 3100 includes a lead frame 3110, a semiconductor die 3120 being attached onto the lead frame 3110, an electrically conductive wire 3130 electrically connecting the lead frame 3110 and the semiconductor die 3120, an encapsulant 3140 encapsulating the electrically conductive wire 3130, and a solder part 3150 being electrically connected to the lead frame 3110.

The lead frame 3110 includes a die paddle 3111 to which the semiconductor die 3120 is mounted, and a plurality of leads 3112 that are formed on a periphery of the die paddle 3111. The die paddle 3111 includes an approximately planar first surface 3111a and an approximately planar second surface 3111b opposite to the first surface 3111a. A partial etching part 3111c is further formed on one end of the second surface 3111b of the die paddle 3111. The partial etching part 3111c is encapsulated by the encapsulant 3140 to thereby prevent separation of the semiconductor package 3100. The second surface 3111b of the die paddle 3111 is externally exposed. The lead 3112 includes an approximately planar first surface 3112a and an approximately planar second surface 3112b opposite to the first surface 3112a. The lead 3112 further includes a partial etching part 3112c that is formed on one end to face the die paddle 3111. The partial etching part 3112c may be formed by the same method as the partial etching part 3111c. The plurality of leads 3112 may be formed in an approximately radial shape. A metal layer 3113 may be further provided on a portion of the first surfaces 3111a and 3112b of the die paddle 3111 and each lead 3112, the portion where the electrically conductive wire 3120 is electrically connected to, or over the entire first surfaces 3111a and 3112a. The metal layer 3113 improves electrical characteristics of the semiconductor package 3100, and prevents the lead frame 3110 from oxidation. The metal layer 3113 may be formed of Ag, Au, Ni, and Pd, or an equivalent thereof, however the present invention is not limited thereto. Also, the solder part 3150 may be electrically connected to the second surfaces 3111b and 3112b of the die paddle 3111 and each lead 3112. Such the die paddle 3111 and the leads 3112 may include cupper alloys or an equivalent thereof, however the present invention is not limited thereto.

The semiconductor die 3120 includes an approximately planar first surface 3120a and an approximately planar second surface 3120b opposite to the first surface 3120a. A plurality of bond pads 3121 is formed on the first surface 3120a, and the second surface 3120b is attached onto the first surface 3111a of the die paddle 3111 using an adhesive 3122.

The electrically conductive wire 3130 electrically connects the lead frame 3110 and the semiconductor die 3120. Specifically, the electrically conductive wire 3130 electrically connects the die paddle 3111 and the bond pad 3121, or the lead 3112 and the bond pad 3121. Also, the electrically conductive wire 3130 may electrically connect the die paddle 3111 and the lead 3112. The electrically conductive wire 3130 may be formed of a material including any one of gold, silver, copper, and aluminum, or an equivalent thereof. However, the present invention is not limited thereto.

The encapsulant 3140 encapsulates the semiconductor die 3120 and the electrically conductive wire 3120. As shown in FIG. 5, the encapsulant 3140 covers the lead frame 3110 to expose the second surfaces 3111b and 3112b of the die paddle 3111 and the lead 3112. The encapsulant 3140 may be made of an equivalent material to the encapsulants 140 and 460 of FIGS. 1 and 2, however the present invention is not limited thereto.

The solder part 3150 includes a solder ball 3151 being electrically connected to at least one lead 3112, and a solder 3152 being electrically connected to the die paddle 3111. Here, the solder 3152 is to electrically connect the die paddle 3111, functioning as a ground, to the circuit board 3200 and thus may not be formed depending on a necessity. The present invention does not particularly limit this. The solder ball 3151 is formed on the second surface 3112b of the lead 3112. The solder 3152 is formed on the second surface 3111b of the die paddle 3111. The solder ball 3151 and the solder 3152 are provided to be electrically connected to the circuit board 3200, which will be described later, and thereby communicate electrical signals of the semiconductor package 3100 with an outside via the circuit board 3200. The solder 3152 may be made of Sn/Pb and Needless Sn or an equivalent thereof, however the present invention is not limited thereto. The solder ball 3151 includes a first interface 3151a and a second interface 3151b that contact with the lead 3112 and the circuit board 3200 respectively. Also, the solder ball 3151 may expose a remaining surface 3151c, excluding the first surface 3151a and the second surface 3151b, between the lead 3112 and the circuit board 3200. The first underfill 3300 is formed on the surface 3151c of the solder ball 3151. Here, a second underfill 3300' may be formed on the solder 3152 by the likewise method to the solder ball 3151. The first and the second underfills 3300 and 3300' will be described in detail later.

The circuit board 3200 includes an insulating layer 3210, a mounting pad 3220, a through via 3230, and a solder mask 3240. The semiconductor package 3100 is mounted onto at least one mounting pad 3220. Also, the circuit board 3200 may be a main board to drive an electronic device, such as a mobile phone, a PDA, and the like, or a sub-board to assist an operation of the main board. However, the present invention is not limited thereto. The circuit board 3200 is substantially identical to the circuit board 200 of FIG. 1 and thus further detailed descriptions related thereto will be omitted here and refer to the circuit board 200.

The first underfill 3300 is disposed between the semiconductor package 3100 and the circuit board 3200. The first underfill 3300 may be provided to surround the solder ball 3151. The first underfill 3300 includes a first region R21 that is formed between a remaining surface 3151c of the solder ball 3151, excluding the first and the second interfaces 3151a and the 3151b, and the lead 3112, a second region R22 that is formed between the surface 3151c of the solder ball 3151 and the circuit board 3200, and a third region R23 that covers an approximately central portion of the surface 3151c of the solder ball 3151. In this case, the underfill is concentrated on the first region R21 and the second region R22, and thus the first region R21 and the second region R22 are formed to have a relatively wider vertical cross-sectional area than the third region R23. An exposed surface of the first region R21 that is formed between the lead 3112 and the circuit board 3200 may have the approximately same shape as an exposed surface of the second region R22 between the lead 3112 and the circuit board 3200. The first underfill 3300 is formed in the approximately same shape as the underfill 300 of FIG. 1, and is formed on each solder ball 3151. Also, the underfill 3300 may include an equivalent material to the underfill 300. The second underfill 3300' may be formed to cover a periphery of the solder 3252 in the approximately same shape as the first underfill 3300.

As described above, the semiconductor package module 40 may reinforce a solder or solder ball binding force between the semiconductor package 3100 and the circuit board 3200 through the first and the second underfills 3300 and 3300'. Accordingly, it is possible to improve the reliability of the semiconductor package module 40.

Hereinafter, a manufacturing method of a semiconductor package module according to the present invention will be described. Here, the manufacturing method will be described based on the semiconductor package module 10. However, the manufacturing method of the semiconductor package may be applicable to the above-described exemplary embodiments.

Figure 6:
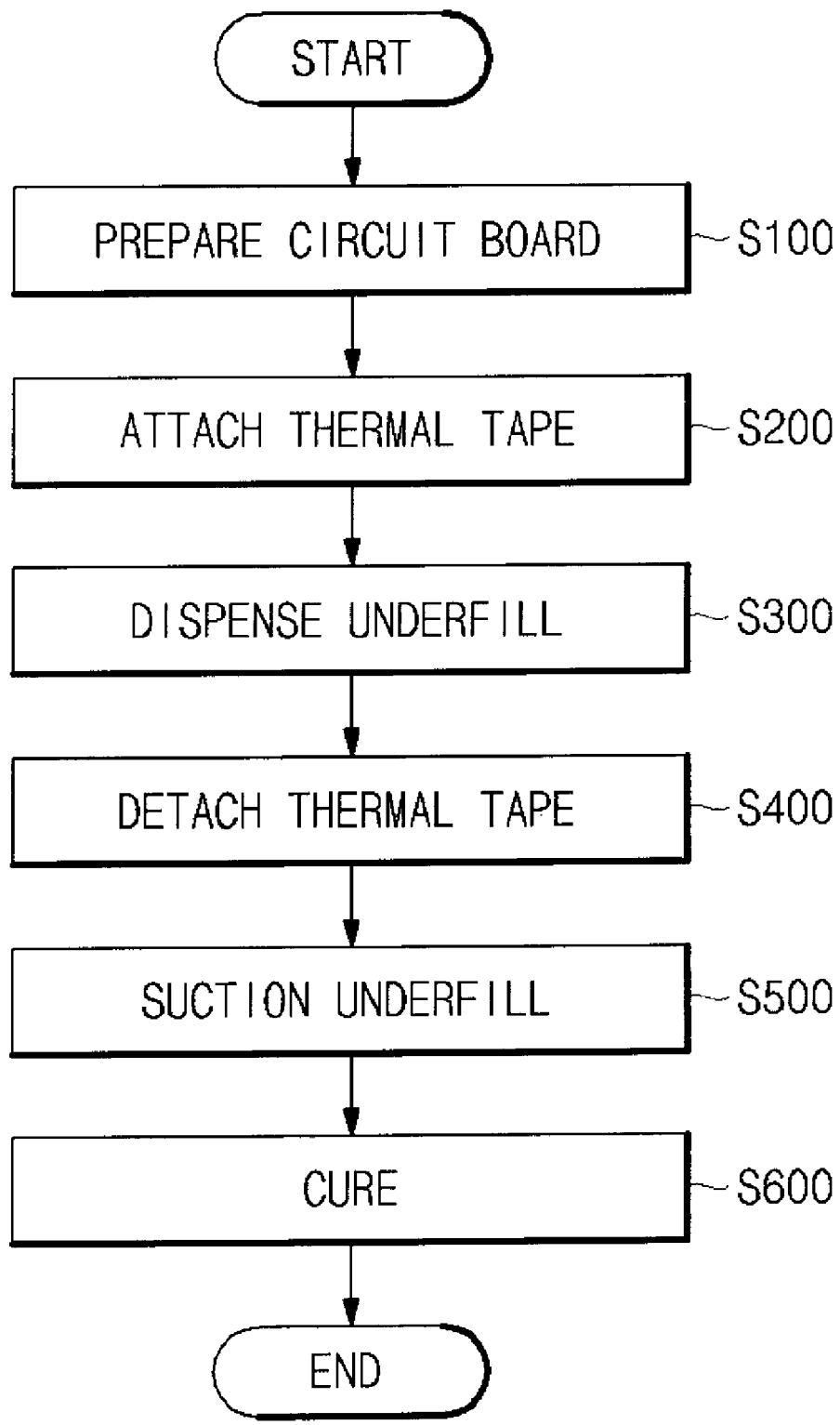
FIG. 6 is a flowchart of a manufacturing method of a semiconductor package module according to an embodiment of the present invention.

Referring to FIG. 6, a flowchart of a manufacturing method of a semiconductor package module according to an exemplary embodiment of the present invention is illustrated. And Referring to FIGS. 7A to 7F, cross-sectional views of a manufacturing method shown in FIG. 6 are illustrated.

As shown in FIG. 6, the manufacturing of the semiconductor package module 10 includes the steps of preparing a circuit board S100, attaching a thermal tape S200, dispensing an underfill S300, detaching a thermal tape 5400, suctioning an underfill S500 and curing an underfill 5600.

Figure 7A:
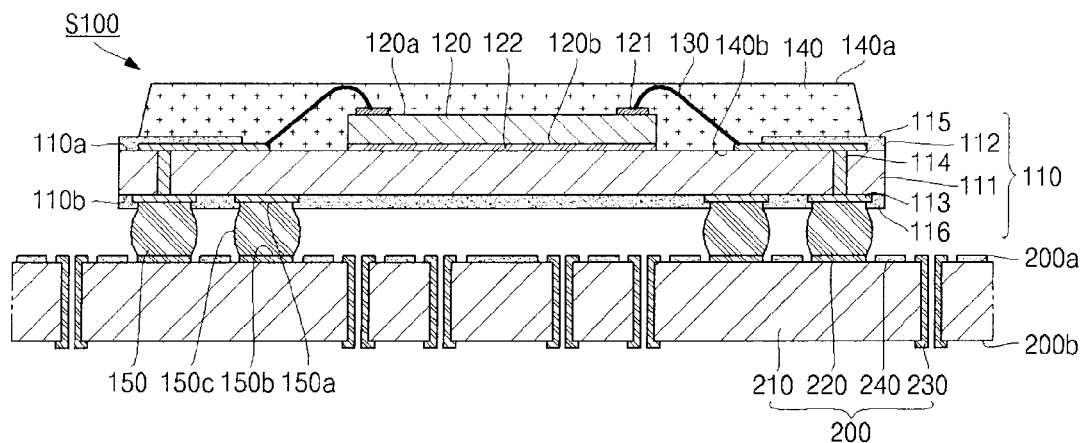
FIGS. 7A to 7F are cross-sectional views of the manufacturing method of the semiconductor package shown in FIG. 6.

As shown in FIG. 7A, the step of preparing the circuit board S100 is shown. The circuit board 200 has an approximately planar first surface 200a and an approximately planar second surface 200b opposite to the first surface 200a. The circuit board 200 includes an insulating layer 210, a mounting pad 220, a through via 230, and a solder mask 240. The mounting pad 220 is formed on the first surface 200a of the circuit board 200. The mounting pad 220 may be formed through a patterning process, such as a photo-lithography after laminating a copper clan on the insulating layer 210. Also, the mounting pad 220 may be plated or treated with OSP processing using gold, silver, and Sn, or an equivalent thereof, in order to have an electrically stable characteristic. However, the present invention does not particularly limit a forming method of the mounting pad 220 and a material thereof. The mounting pad 220 may further include a connector (not shown for an electrical connection to an external device and a component (not shown) such as a capacitor, resistance, and the like, in addition to the first semiconductor package 100. However, the present invention is not limited thereto. A through via 230 may be formed between the first surface 200a and the second surface 200b of the circuit board 200. The through via 230 may be formed by initially making a hole in the circuit board 200 using a drill using a laser and a CNC, or an equivalent method, and then plating the hole with copper and the like. However, the present invention does not particularly limit the forming method of the through via 230. The through via 230 may be generally formed to help complex wiring of the circuit board 200, and functions as a connection path when electrically connecting the circuit board 200 and another circuit board (not shown). Also, the through via 230 may be used as an underfill discharge path to form the first underfill 300, which will be described later. A forming method of the first underfill 300 using the through via 230 will be described later. A solder mask 240 is provided to cover a periphery of the through via 230 and the mounting pad 220 on the first surface 200a of the circuit board 200. The solder mask 240 may be provided to cover a portion of the mounting pad 220 or the through via 230, however the present invention is not limited thereto. Another solder mask (not shown) may be further formed on the second surface 200b of the circuit board 200 to cover a conductive pad (not shown), such as the mounting pad 220 and a periphery of the conductive pad. Also, the circuit board 200 of FIG. 7A is formed in a single layer, however, the circuit board 200 may be provided in a multi-layer configuration depending on a type of a semiconductor package module or a design of those skilled in the art. The present invention is not limited thereto. Also, the circuit board 200 may be a main board to drive an electronic device, such as a mobile phone, a PDA, and the like, or a sub-board to assist an operation of the main board. However, the present invention is not limited thereto.

A first semiconductor package 100 may be mounted onto the mounting pad 220. For example, the mounting pad 220 may be electrically connected to the first solder ball 150 that is formed on the first semiconductor package 100. The first semiconductor package 100 may be mounted onto the circuit board 200 by an SMT scheme. The first semiconductor package 100 of FIG. 7A uses a BGA scheme. However, the type of the first semiconductor package 100 applied to the present invention is not limited thereto. Any one of a PoP using a solder ball connection method, an MLF, and a WLCSP, or a semiconductor package using an equivalent method thereof may be used.

Figure 7B:
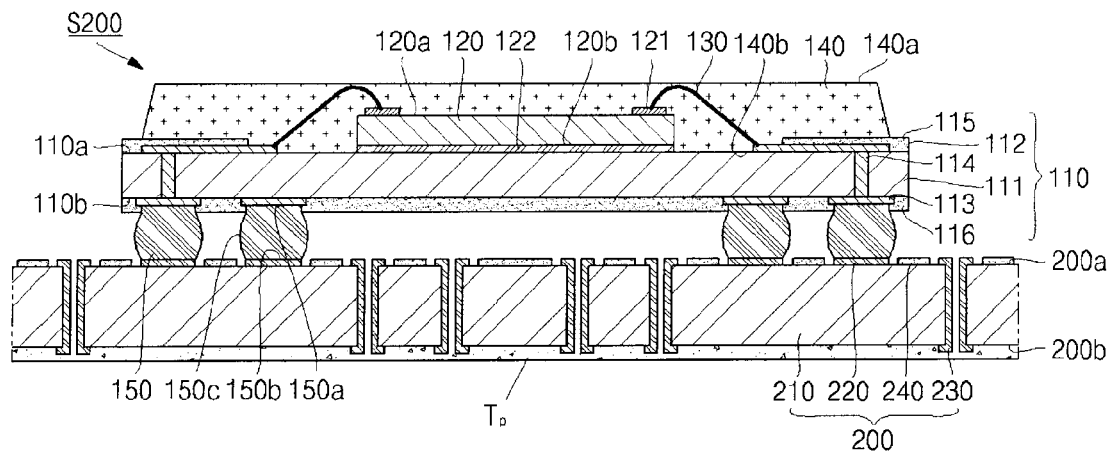

As shown in FIG. 7B, the step of attaching the thermal tape S200 attaches a thermal tape Tp on the second surface 200b of the circuit board 200. The thermal tape Tp prevents an underfill material Uf from falling into the second surface 200b of the circuit board 200 while the underfill material Uf is dispensed between the first semiconductor package 100 and the circuit board 200. Specifically, the thermal tape Tp functions to stop the through via 230. The thermal tape Tp may be attached over the whole second surface 200b of the circuit board 200, or may be attached onto only a portion where the through via 230 is formed, depending on a necessity. The present invention is not limited thereto. The thermal tape Tp may be made of a relatively readily detachable material, and has an excellent heat-resisting property while the underfill material Uf is being cured. The thermal tape Tp may include any one of epoxy, ceramic, and aluminum, or an equivalent material thereof, or a composition thereof, however the present invention is not limited thereto.

Figure 7C:
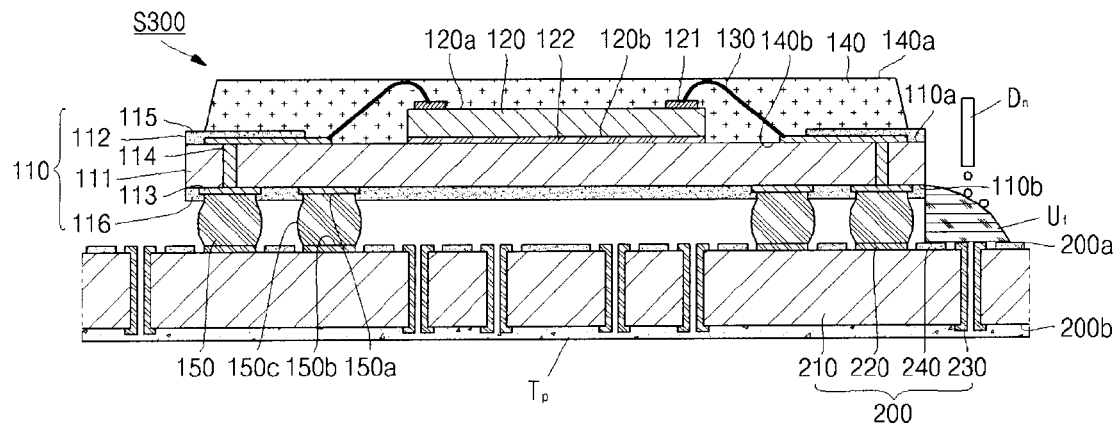

As shown in FIG. 7C, the step of dispensing the underfill S300 dispenses the underfill material Uf to dispose the first underfill 300 between the first semiconductor package 100 and the first surface 200a of the circuit board 200. The underfill material Uf is dispensed between the first semiconductor package 100 and the circuit board 200 in a gel-type ink or paste. The underfill material Uf may include any one of an epoxy resin, a thermosetting resin, and a polymer, or an equivalent material thereof. The underfill material Uf may be dispensed by a dispensing method using a stencil printing method or a capillary phenomenon. For example, the underfill material Uf may be dispensed between the first semiconductor package 100 and the circuit board 200 using a dispensing needle Dn. However, the present invention does not limit the matter of the underfill material Uf and a forming method thereof.

Figure 7D:
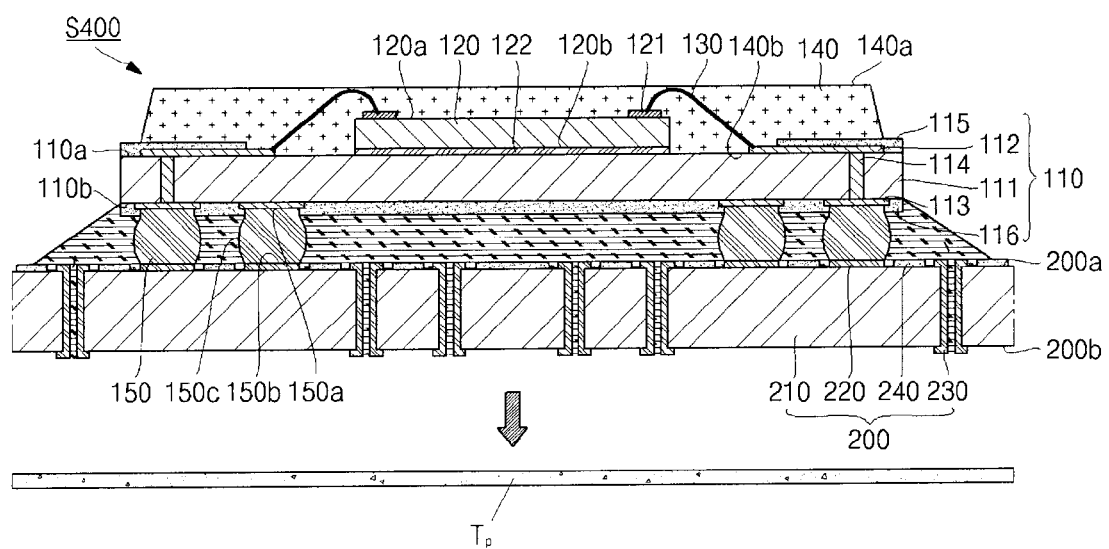

As shown in FIG. 7D, the step of detaching the thermal tape S400 detaches the thermal tape Tp from the circuit board 200 after dispensing the underfill material Uf between the first semiconductor package 100 and the first surface 200a of the circuit board 200. The through via 230 of the circuit board 200 is re-opened by removing the thermal tape Tp. Therefore, when suctioning the underfill material Uf, a remaining underfill material Uo, excluding the underfill material Uf formed around the solder ball interfaces 150a and 150b of the first solder ball 150, is discharged from the through via 230.

Figure 7E:
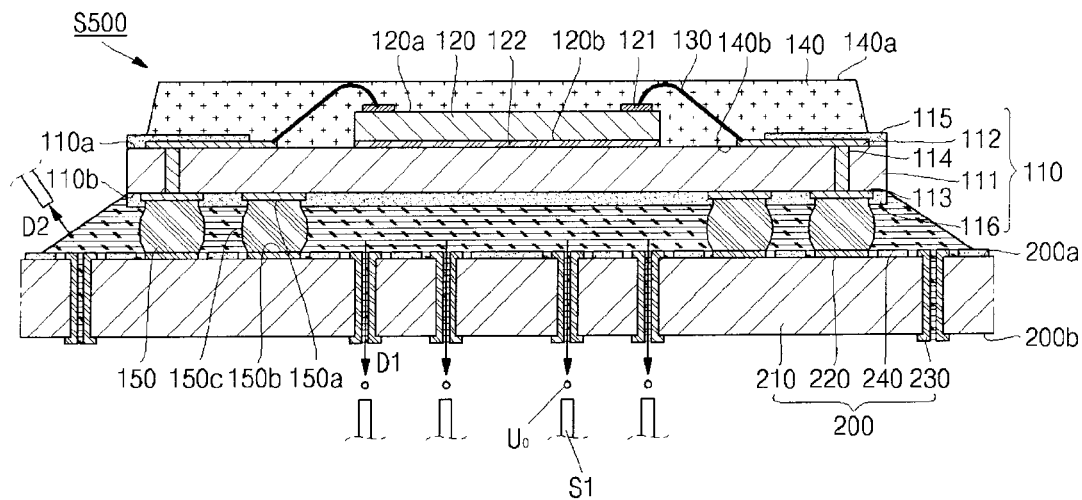

As shown in FIG. 7E, the step of suctioning the underfill S500 suctions the remaining underfill material Uo using suctions S1 and S2. The remaining underfill material Uo may be suctioned in a lower direction D1 of the circuit board 200 and a side direction D2 of the semiconductor package. However, the present invention is not limited thereto. Also, the suctioning of the remaining underfill material Uo may be performed in a vacuum state. In the step of suctioning the underfill S500, the remaining underfill material Uo is discharged using the suctions S1 and S2 before the underfill material Uf is hardened and thereby becomes in a solid state.

Figure 7F:
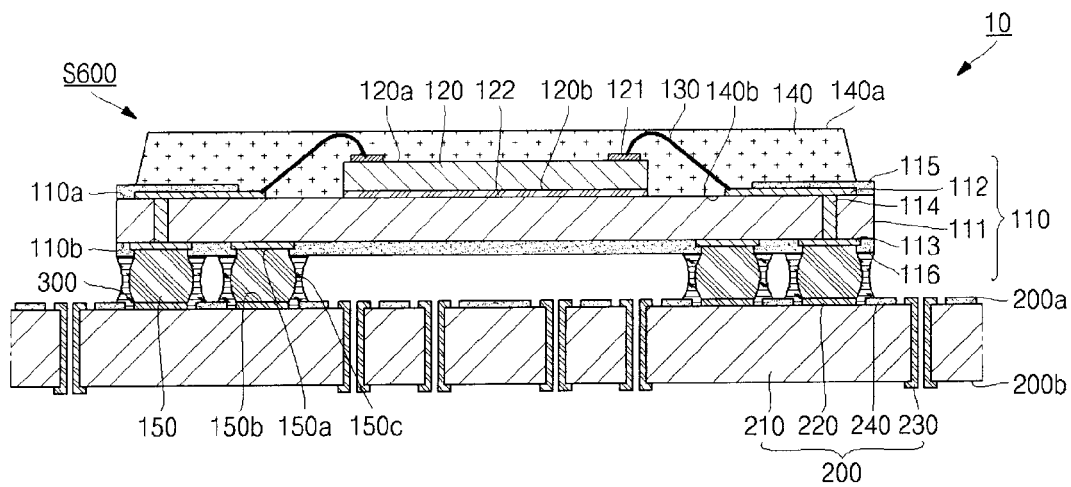

As shown in FIG. 7F, the step of curing the underfill S600 cures the underfill material Uf in a temperature of about 150° C. to about 170° C., and completes the first underfill 300 in a shape of an approximately sandglass. When the remaining underfill material Uo is discharged or suctioned in the step of suctioning the underfill S500, the first underfill 300 is formed to surround the first solder ball 150 based on the solder ball interfaces 150a and 150b. Specifically, as the underfill material Uf is hardened by heat, the shape of the first underfill 300 is maintained in a solid state.

According to the manufacturing method of the semiconductor package module 10, the first underfill 300 is formed only based on the solder ball interfaces 150a and 150b, and thus the reliability of the semiconductor package module 10 may be improved. Specifically, since the first underfill 300 is formed to be relatively smaller than before, and is not contracted or expanded by heat, the first underfill 300 does not greatly affect a binding force in a contact portion between each of the first semiconductor package 100 and the circuit board 200, and the solder ball 150. Thus, the reliability of the semiconductor package module 10 may be improved.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package assembly comprising:
a first semiconductor package;
a plurality of first solder balls attached to a first surface of the first semiconductor package;
a circuit board having a plurality of mounting pads that is electrically connected to the plurality of first solder balls;
a plurality of vias formed through the circuit board;
a first underfill disposed between gaps of each of the plurality of first solder balls creating a void between at least two adjacent first solder balls;
a plurality of second solder balls attached to a second surface of the first semiconductor package; and
a second underfill disposed between gaps of each of the plurality of second solder balls creating a void between at least two adjacent second solder balls;
wherein the first semiconductor package comprises:
a first substrate having a first surface and a second surface, wherein a plurality of first conductive patterns is formed on the first surface of the first substrate and a plurality of second conductive patterns is formed on the second surface of the first substrate;
a first semiconductor die attached to the first surface of the substrate;
at least one first electrically conductive wire connecting at least one first conductive pattern and the first semiconductor die;
a first encapsulant surrounding a periphery of the first electrically conductive wire and the first semiconductor die;
wherein the plurality of first solder balls is electrically connected to at least one second conductive pattern;
at least one third conductive pattern being formed on a periphery of the first encapsulant on the first surface of the first substrate;
a second semiconductor package electrically connected to the third conductive pattern, wherein the second semiconductor package comprises:
a second substrate having a first surface and a second surface, wherein a plurality of fourth conductive patterns is formed on the first surface and a plurality of fifth conductive patterns is formed on the second surface of the second substrate;
a second semiconductor die attached to the first surface of the second substrate;
at least one second electrically conductive wire electrically connecting at least one fourth conductive pattern and the second semiconductor die; and
a second encapsulant being surrounding a periphery of the second electrically conductive wire and the second semiconductor die;
wherein the plurality of second solder balls is electrically connected to at least one third conductive pattern, and at least one fifth conductive pattern;
wherein the first underfill has been removed above a first group of the plurality of vias.

2. A semiconductor package assembly in accordance with claim 1, wherein the first underfill comprises:
a first region formed between the surface of each first solder ball and the first substrate;
a second region formed between the surface of each first solder ball and the circuit board; and
a third region formed between the first region and the second region that covers an approximately central portion of the surface of each first solder ball;
wherein the first region and the second region are formed to have a wider vertical cross-sectional than the third region.

3. A semiconductor package assembly in accordance with claim 1, wherein the first underfill forms an approximate sandglass shape on each of the plurality of first solder balls.

4. A semiconductor package assembly in accordance with claim 3, wherein the first underfill comprises one of: an epoxy resin, a thermosetting resin, a polymer, or combinations thereof.

5. A semiconductor package assembly in accordance with claim 1, further comprising at least one through via formed through the circuit board.

6. A semiconductor package assembly in accordance with claim 1, wherein the second underfill comprises:
- a first region formed between each of the plurality of second solder balls and the second substrate;
- a second region formed between each of the plurality of second solder balls and the first substrate; and
- a third region formed between the first region and the second region and covers an approximately central portion of the surface of each of the plurality of second solder balls;
- wherein the first region and the second region are formed to have a relatively wider vertical cross-sectional area than the third region.

7. A semiconductor package assembly in accordance with claim 1, wherein the second underfill forms an approximate sandglass shape on each of the plurality of second solder balls.

8. A semiconductor package assembly in accordance with claim 1, wherein the second underfill comprises one of: an epoxy resin, a thermosetting resin, a polymer, or combinations thereof.

9. A semiconductor package assembly in accordance with claim 1, wherein the first semiconductor package is a wafer level chip scale package.

10. A semiconductor package assembly in accordance with claim 1, wherein the first group of the plurality of vias is positioned under the first semiconductor package and are suction vias to remove the first underfill from above the first group of the plurality of vias.

11. A semiconductor package assembly in accordance with claim 10, wherein a second group of the plurality of vias is positioned on an outer perimeter of the circuit board outside a width of the first semiconductor package and the second semiconductor package.

\* \* \* \* \*